US012592285B2

(12) United States Patent
Kim

(10) Patent No.: US 12,592,285 B2
(45) Date of Patent: Mar. 31, 2026

(54) INTERLEAVED PAGE BUFFERS FOR INPUTTING AND OUTPUTTING DATA WITH MEMORY LATCHES AND STATUS REGISTERS INCLUDING A MEMORY DEVICE

(71) Applicant: SK hynix Inc., Icheon-si (KR)

(72) Inventor: Byoung Young Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 211 days.

(21) Appl. No.: 18/505,983

(22) Filed: Nov. 9, 2023

(65) Prior Publication Data

US 2024/0420776 A1 Dec. 19, 2024

(30) Foreign Application Priority Data

Jun. 14, 2023 (KR) ........................ 10-2023-0076197

(51) Int. Cl.
*G11C 16/26* (2006.01)
*G11C 7/10* (2006.01)
*G11C 16/04* (2006.01)
*G11C 16/10* (2006.01)

(52) U.S. Cl.
CPC ............ *G11C 16/26* (2013.01); *G11C 7/1039* (2013.01); *G11C 7/1042* (2013.01); *G11C 7/106* (2013.01); *G11C 7/1087* (2013.01); *G11C 16/0433* (2013.01); *G11C 16/102* (2013.01)

(58) Field of Classification Search
CPC ..... G11C 16/26; G11C 7/1039; G11C 7/1042;

G11C 7/106; G11C 7/1087; G11C 16/0433; G11C 16/102; G11C 11/5642; G11C 16/0483; G11C 16/08; G11C 16/10; G11C 16/24; G06F 3/0658; G06F 3/0659; G06F 3/0679
See application file for complete search history.

(56) References Cited

U.S. PATENT DOCUMENTS

| | | | | |
|---|---|---|---|---|
| 2017/0255514 A1* | 9/2017 | Honma | ................. | G06F 3/0619 |
| 2022/0051729 A1* | 2/2022 | Cho | ........................ | H01L 24/08 |
| 2023/0129283 A1* | 4/2023 | Jung | .................... | G11C 7/1087 |
| | | | | 365/189.05 |
| 2024/0201875 A1* | 6/2024 | Juan | ...................... | G06F 3/0653 |

FOREIGN PATENT DOCUMENTS

| | | |
|---|---|---|
| KR | 1020090030406 A | 3/2009 |
| KR | 1020170090262 A | 8/2017 |

* cited by examiner

*Primary Examiner* — Donald HB Braswell

(74) *Attorney, Agent, or Firm* — WILLIAM PARK AND ASSOCIATES LTD.

(57) ABSTRACT

Provided herein is a memory device for inputting and outputting data and a memory system including the memory device and a memory controller. The memory device includes memory cells, a plurality of latches configured to sense a plurality of pieces of logical page data stored in the memory cells, and an operation controller configured to output a first latch select signal for selecting first latches, by which first logical page data among the plurality of pieces of logical page data is sensed, from among the plurality of latches in response to a first page data output command. The first latches output the first logical page data in response to the first latch select signal.

17 Claims, 11 Drawing Sheets

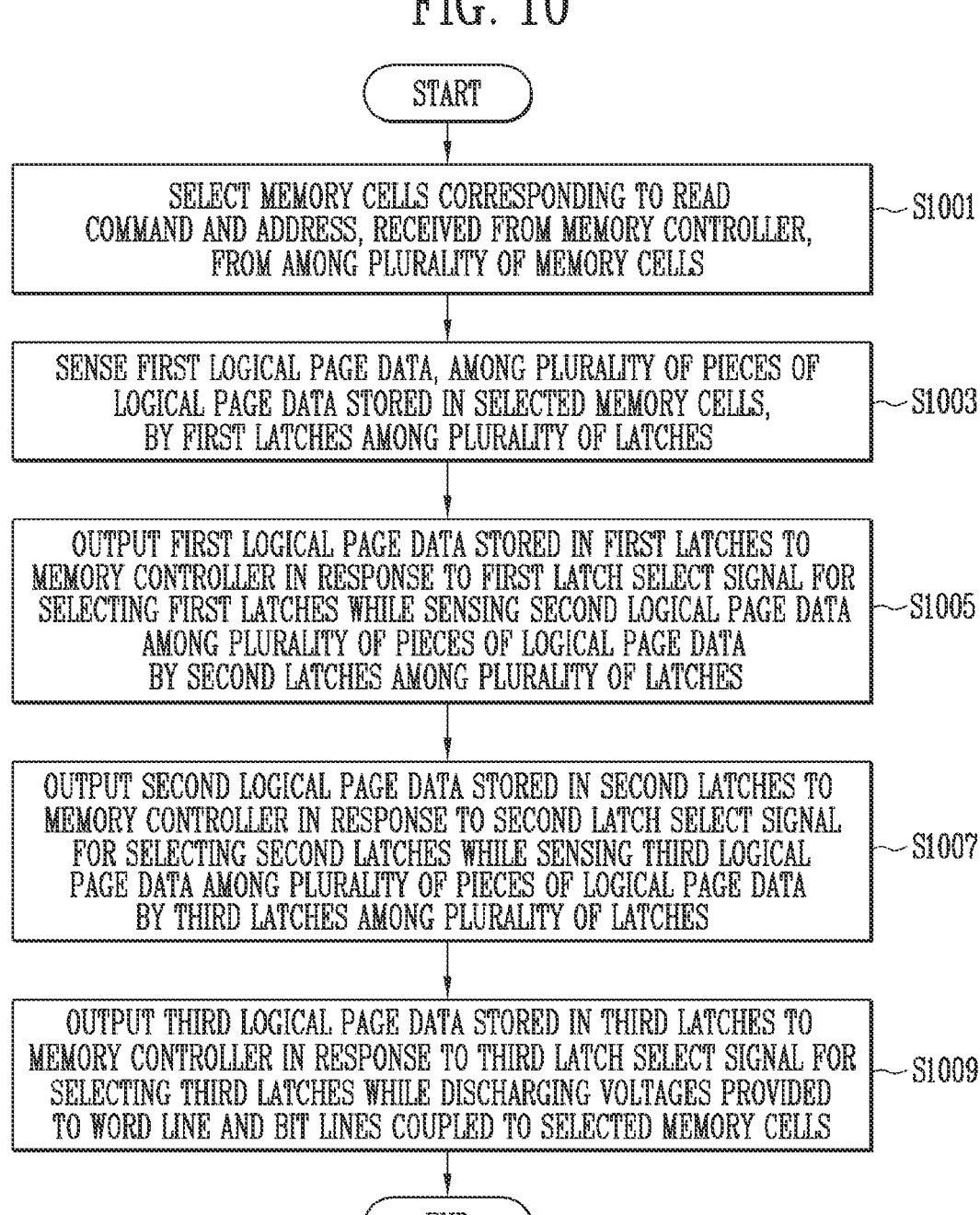

START

SELECT MEMORY CELLS CORRESPONDING TO READ
COMMAND AND ADDRESS, RECEIVED FROM MEMORY CONTROLLER,
FROM AMONG PLURALITY OF MEMORY CELLS ~S1001

SENSE FIRST LOGICAL PAGE DATA, AMONG PLURALITY OF PIECES OF
LOGICAL PAGE DATA STORED IN SELECTED MEMORY CELLS,
BY FIRST LATCHES AMONG PLURALITY OF LATCHES ~S1003

OUTPUT FIRST LOGICAL PAGE DATA STORED IN FIRST LATCHES TO
MEMORY CONTROLLER IN RESPONSE TO FIRST LATCH SELECT SIGNAL FOR
SELECTING FIRST LATCHES WHILE SENSING SECOND LOGICAL PAGE DATA
AMONG PLURALITY OF PIECES OF LOGICAL PAGE DATA
BY SECOND LATCHES AMONG PLURALITY OF LATCHES ~S1005

OUTPUT SECOND LOGICAL PAGE DATA STORED IN SECOND LATCHES TO
MEMORY CONTROLLER IN RESPONSE TO SECOND LATCH SELECT SIGNAL
FOR SELECTING SECOND LATCHES WHILE SENSING THIRD LOGICAL
PAGE DATA AMONG PLURALITY OF PIECES OF LOGICAL PAGE DATA
BY THIRD LATCHES AMONG PLURALITY OF LATCHES ~S1007

OUTPUT THIRD LOGICAL PAGE DATA STORED IN THIRD LATCHES TO
MEMORY CONTROLLER IN RESPONSE TO THIRD LATCH SELECT SIGNAL FOR
SELECTING THIRD LATCHES WHILE DISCHARGING VOLTAGES PROVIDED
TO WORD LINE AND BIT LINES COUPLED TO SELECTED MEMORY CELLS ~S1009

END

INTERLEAVED PAGE BUFFERS FOR INPUTTING AND OUTPUTTING DATA WITH MEMORY LATCHES AND STATUS REGISTERS INCLUDING A MEMORY DEVICE

CROSS-REFERENCE TO RELATED APPLICATION

The present application claims priority under 35 U.S.C. § 119(a) to Korean patent application number 10-2023-0076197 filed on Jun. 14, 2023, in the Korean Intellectual Property Office, the entire disclosure of which is incorporated by reference herein.

BACKGROUND

1. Technical Field

Various embodiments of the present disclosure generally relate to an electronic device, and more particularly, to a memory device configured to input and output data and a memory system including the memory device and a memory controller.

2. Related Art

A memory system is a device which stores data under the control of a host device such as a computer or a smartphone. The memory system may include a memory device in which data is stored and a memory controller which controls the memory device. Memory devices are classified into a volatile memory device and a nonvolatile memory device.

The nonvolatile memory device may be a memory device in which stored data is retained even when the supply of power is interrupted. Examples of the nonvolatile memory device may include a read only memory (ROM), a programmable ROM (PROM), an electrically programmable ROM (EPROM), an electrically erasable and programmable ROM (EEPROM), and a flash memory.

The nonvolatile memory device may perform a read operation of reading data stored in memory cells selected from among a plurality of memory cells. The data stored in the selected memory cells may include a plurality of pieces of logical page data. The nonvolatile memory device may sequentially read pieces of logical page data stored in the selected memory cells in response to a command provided from the memory controller during the read operation. During the read operation, the nonvolatile memory device may output the plurality of pieces of logical page data to the memory controller in response to the command provided from the memory controller.

The nonvolatile memory device may perform a program operation of storing data in memory cells selected from among the plurality of memory cells. In the selected memory cells, the plurality of pieces of logical page data may be stored. The nonvolatile memory device may sequentially store a plurality of pieces of logical page data received from the memory controller during the program operation.

SUMMARY

An embodiment of the present disclosure may provide for a memory device. The memory device may include memory cells, a plurality of latches configured to sense a plurality of pieces of logical page data stored in the memory cells, and an operation controller configured to output a first latch select signal for selecting first latches, by which first logical page data among the plurality of pieces of logical page data is sensed, from among the plurality of latches in response to a first page data output command. The first latches may output the first logical page data in response to the first latch select signal.

An embodiment of the present disclosure may provide for a memory system. The memory system may include a memory device including a plurality of latches configured to sense a plurality of pieces of logical page data stored in a physical page, and a memory controller configured to provide the memory device with a first page data output command that requests first logical page data among the plurality of pieces of logical page data. The memory device may be configured to transmit the first logical page data from the first latches to the memory controller in response to activation of a first latch select signal for selecting first latches in which the first logical page data is stored among the plurality of latches.

An embodiment of the present disclosure may provide for a method of operating a memory device. The method may include storing first logical page data among a plurality of pieces of logical page data stored in memory cells, in first latches among a plurality of latches, activating a first latch select signal for selecting the first latches in response to a data output command that requests the first logical page data, and outputting the first logical page data stored in the first latches to an external device in response to the first latch select signal.

An embodiment of the present disclosure may provide for a memory device. The memory device may include memory cells, a plurality of latches coupled to the memory cells through bit lines, and an operation controller configured to output a first latch select signal for selecting first latches, in which first logical page data among a plurality of pieces of logical page data to be stored in the memory cells is to be stored, from among the plurality of latches in response to a program command. The first latches may store the first logical page data received from an external device in response to the first latch select signal.

BRIEF DESCRIPTION OF THE DRAWINGS

FIG. 6 is a diagram illustrating an embodiment of an operation of receiving data during a program operation.

FIG. 10 is a flowchart illustrating an embodiment of a read operation of a memory device.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Various embodiments of the present disclosure are directed to a memory device capable of reducing the time required to perform a program operation and a read operation, and a memory system including the memory device and a memory controller.

Figure 1:
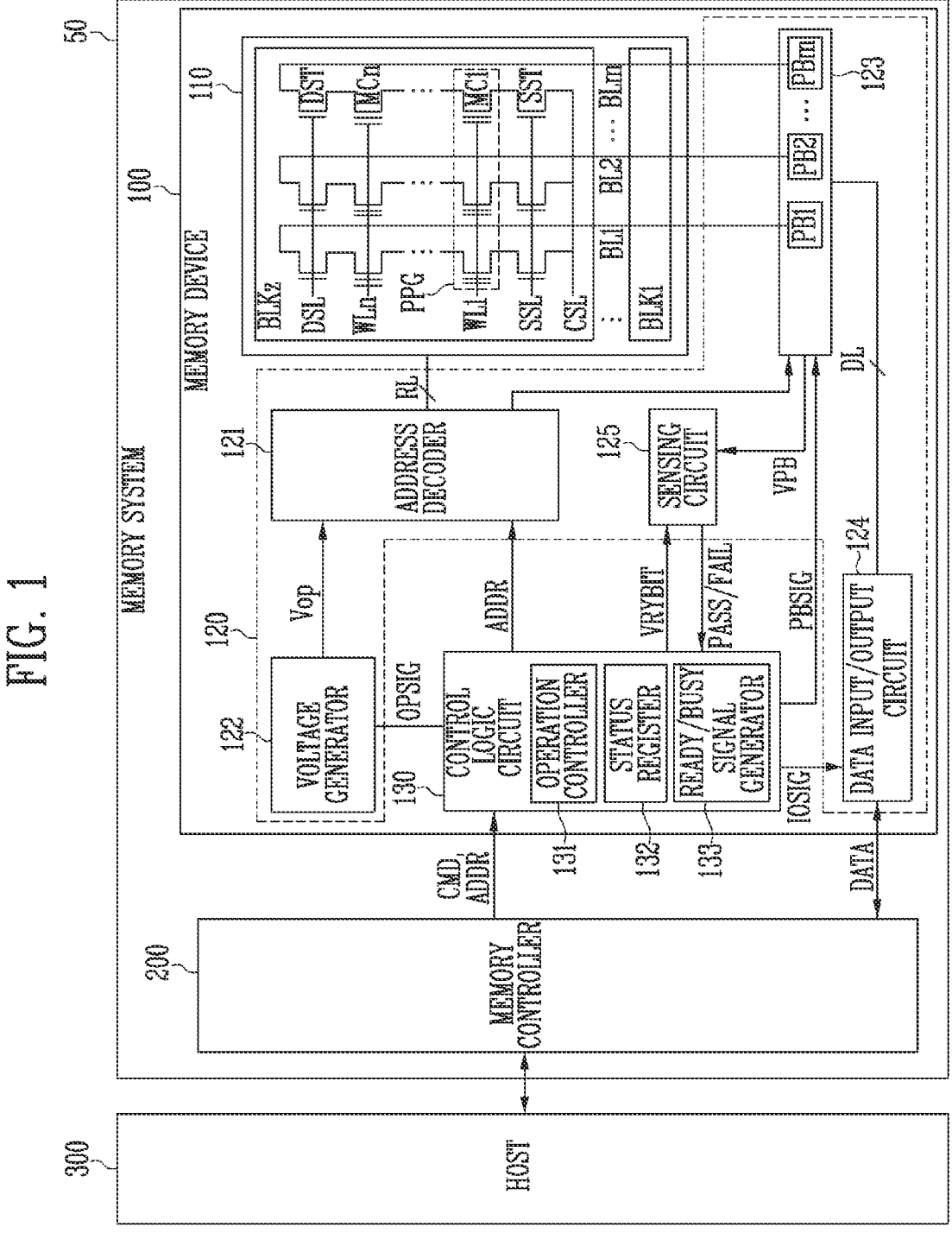
FIG. 1 is a diagram illustrating an embodiment of a memory system including a memory device and a memory controller.

FIG. 1 is a diagram illustrating a memory system including a memory device and a memory controller.

Referring to FIG. 1, a memory system 50 may include a memory device 100 and a memory controller 200. The memory system 50 may be a device that is included in a mobile phone, a computer or the like and that stores data under the control of a host 300 which is an external device. The memory system 50 may be manufactured as various types of storage devices such as a solid state drive (SSD) and a universal flash storage (UFS) depending on a host interface that is a scheme for communication with the host 300. The memory system 50 may be manufactured in various types of package forms such as a system-on-chip (SOC).

The memory device 100 may store data. The memory device 100 may be operated under the control of the memory controller 200. In an embodiment, the memory device 100 may be a nonvolatile memory device or a volatile memory device.

The memory device 100 may receive a command CMD and an address ADDR from the memory controller 200, and may perform an operation indicated by the command CMD on an area selected by the address ADDR. The memory device 100 may perform a program operation (write operation) of storing data in the area selected by the address ADDR, a read operation of reading data from the area, or an erase operation of erasing data stored in the area.

In an embodiment, the memory device 100 may include a memory cell array 110, a peripheral circuit 120, and a control logic circuit 130.

The memory cell array 110 may include a plurality of memory blocks BLK1 to BLKz. The plurality of memory blocks BLK1 to BLKz may be coupled to an address decoder 121 through row lines RL. The plurality of memory blocks BLK1 to BLKz may be coupled to a page buffer group 123 through bit lines BL1 to BLm. Each of the memory blocks BLK1 to BLKz may include a plurality of memory cells. In an embodiment, the plurality of memory cells may be nonvolatile memory cells.

Each of the memory cells may be implemented as a single-level cell (SLC) capable of storing one bit of data, a multi-level cell (MLC) capable of storing two bits of data, a triple-level cell (TLC) capable of storing three bits of data, a quad-level cell (QLC) capable of storing four bits of data, or a memory cell capable of storing five or more bits of data.

In an embodiment, any one memory block BLKz, among the plurality of memory blocks BLK1 to BLKz, may include a plurality of word lines WL1 to WLn arranged in parallel between a drain select line DSL and a source select line SSL.

The memory block BLKz may include a plurality of memory cell strings coupled between any one bit line and a common source line CSL. The bit lines BL1 to BLm may be coupled to the plurality of memory cell strings, respectively, and the common source line CSL may be coupled in common to the plurality of memory cell strings.

For example, each memory cell string may include a drain select transistor DST, a plurality of memory cells MC1 to MCn, and a source select transistor SST, which are coupled in series to each other between the common source line CSL and the first bit line BL1. One memory cell string may include at least one drain select transistor DST and at least one source select transistor SST.

A drain of the drain select transistor DST may be coupled to the first bit line BL1, and a source of the source select transistor SST may be coupled to the common source line CSL. The plurality of memory cells MC1 to MCn may be coupled in series between the drain select transistor DST and the source select transistor SST. Gates of the source select transistors SST included in different memory cell strings may be coupled to the source select line SSL, gates of the drain select transistors DST included in different memory cell strings may be coupled to the drain select line DSL, and gates of the memory cells MC1 to MCn may be coupled to the plurality of word lines WL1 to WLn, respectively. Memory cells coupled to the same word line, among the memory cells included in different memory cell strings, may be defined as a 'physical page (PPG)'. The memory block BLKz may include a number of physical pages identical to the number of word lines WL1 to WLn. One physical page may include a plurality of logical pages. In an embodiment, when one memory cell is a triple-level cell for storing three bits of data, one physical page may include three logical pages. The three logical pages may be a least significant bit (LSB) page, a central significant bit (CSB) page, and a most significant bit (MSB) page.

The peripheral circuit 120 may drive the memory cell array 110. In an example, the peripheral circuit 120 may drive the memory cell array 110 so that a program operation, a read operation, and an erase operation are performed under the control of the control logic circuit 130. In an example, the peripheral circuit 120 may apply various operating voltages to the row lines RL and the bit lines BL1 to BLm or discharge the applied voltages, under the control of the control logic circuit 130.

The peripheral circuit 120 may include the address decoder 121, a voltage generator 122, the page buffer group 123, a data input/output circuit 124, and a sensing circuit 125.

The address decoder 121 may be coupled to the memory cell array 110 through the row lines RL. The row lines RL may include drain select lines, dummy word lines, the plurality of word lines, and source select lines.

The address decoder 121 may be operated in response to the control of the control logic circuit 130. The address decoder 121 may receive addresses ADDR from the control logic circuit 130.

The address decoder 121 may decode a block address among the received addresses ADDR. The address decoder 121 may select at least one of the memory blocks BLK1 to BLKz according to the decoded block address. The address decoder 121 may decode a row address among the received addresses ADDR. The address decoder 121 may select at least one word line of the selected memory block by applying voltages supplied from the voltage generator 122 to the at least one word line according to the decoded row address.

During a program operation, the address decoder 121 may apply a program voltage to the selected word line and apply a pass voltage having a level lower than that of the program voltage to unselected word lines. During a program verify operation, the address decoder 121 may apply a verify voltage to the selected word line and apply a verify pass voltage having a level higher than that of the verify voltage to the unselected word lines.

During a read operation, the address decoder 121 may apply a read voltage to the selected word line and apply a read pass voltage having a level higher than that of the read voltage to unselected word lines.

The address decoder 121 may decode a column address among the received addresses ADDR. The decoded column address may be transferred to the page buffer group 123. For example, the address decoder 121 may include components such as a row decoder, a column decoder, and an address buffer.

The voltage generator 122 may generate a plurality of operating voltages Vop using an external supply voltage that is supplied to the memory device 100. The voltage generator 122 may be operated under the control of the control logic circuit 130.

In an embodiment, the voltage generator 122 may generate various operating voltages Vop that are used for program, read, and erase operations in response to an operation signal OPSIG. For example, the voltage generator 122 may generate a plurality of erase voltages, a plurality of program voltages, a plurality of pass voltages, a plurality of select read voltages, and a plurality of unselect read voltages. The generated operating voltages Vop may be supplied to the memory cell array 110 by the address decoder 121.

The page buffer group 123 may include first to m-th page buffers PB1 to PBm. The first to m-th page buffers PB1 to PBm may be coupled to the memory cell array 110 through the first to m-th bit lines BL1 to BLm, respectively. The first to m-th page buffers PB1 to PBm may be operated under the control of the control logic circuit 130.

The first to m-th page buffers PB1 to PBm may transmit/receive data DATA to/from the data input/output circuit 124. During a program operation, the first to m-th page buffers PB1 to PBm may receive data DATA through the data input/output circuit 124 and data lines DL.

During a program operation, the first to m-th page buffers PB1 to PBm may transfer the data DATA, received through the data input/output circuit 124, to selected memory cells through the bit lines BL1 to BLm. The memory cells in the selected page may be programmed based on the received data DATA. Memory cells coupled to a bit line to which a program-enable voltage (e.g., a ground voltage) is applied may have increased threshold voltages. The threshold voltages of memory cells coupled to a bit line to which a program-inhibit voltage (e.g., a supply voltage) is applied may be maintained. During a verify operation, the first to m-th page buffers PB1 to PBm may read the data DATA stored in the selected memory cells from the selected memory cells through the bit lines BL1 to BLm.

During a read operation, the page buffer group 123 may sense data from memory cells coupled to the selected word line through the bit lines BL1 to BLm, and may store the sensed data in the first to m-th page buffers PB1 to PBm.

The data input/output circuit 124 may be coupled to the first to m-th page buffers PB1 to PBm through the data lines DL. The data input/output circuit 124 may be operated under the control of the control logic circuit 130.

The data input/output circuit 124 may include a plurality of input/output buffers (not illustrated) which receive input data DATA. During a program operation, the data input/output circuit 124 may receive the data DATA to be stored from the memory controller 200. During a read operation, the data input/output circuit 124 may output the sensed data stored in the first to m-th page buffers PB1 to PBm to the memory controller.

During a verify operation, the sensing circuit 125 may generate a reference current in response to an enable bit signal VRYBIT generated by the control logic circuit 130, and may output a pass signal or a fail signal to the control logic circuit 130 by comparing a sensing voltage VPB received from the page buffer group 123 with a reference voltage generated by the reference current. In an example, the sensing circuit 125 may output the pass signal to the control logic circuit 130 when the magnitude of the sensing voltage VPB is less than that of the reference voltage. In an example, the sensing circuit 125 may output a fail signal to the control logic circuit 130 when the magnitude of the sensing voltage VPB is greater than that of the reference voltage.

The control logic circuit 130 may be coupled to the address decoder 121, the voltage generator 122, the page buffer group 123, the data input/output circuit 124, and the sensing circuit 125. The control logic circuit 130 may control the overall operation of the memory device 100. The control logic circuit 130 may be operated in response to the command CMD received from the memory controller 200.

The control logic circuit 130 may control the peripheral circuit 120 by generating various types of signals in response to the command CMD and the address ADDR. For example, the control logic circuit 130 may generate the operation signal OPSIG, the addresses ADDR, a page buffer control signal PBSIG, the enable bit signal VRYBIT, and an input/output signal IOSIG in response to the command CMD and the address ADDR. The control logic circuit 130 may output the operation signal OPSIG to the voltage generator 122, may output the addresses ADDR to the address decoder 121, may output the page buffer control signal PBSIG to the page buffer group 123, may output the enable bit signal VRYBIT to the sensing circuit 125, and may output the input/output signal IOSIG to the data input/output circuit 124.

In an embodiment, the control logic circuit 130 may include an operation controller 131, a status register 132, and a ready/busy signal generator 133.

In an embodiment, the operation controller 131 may receive a read command and an address from the memory controller 200. The operation controller 131 may select memory cells corresponding to the address from among the plurality of memory cells. The selected memory cells may form one physical page. The operation controller 131 may control the peripheral circuit 120 to perform a read operation on the selected memory cells in response to the read command. The read operation may be an operation of reading data stored in the selected memory cells. The data stored in the selected memory cells may include a plurality of pieces of logical page data. In an embodiment, when selected memory cells are triple-level cells, data stored in the selected memory cells may include LSB page data, CSB page data, and MSB page data. In an embodiment, the operation controller 131 may control the peripheral circuit 120 to read the LSB page data, the CSB page data, and the MSB page data, which are stored in the selected memory cells.

The operation controller 131 may control the peripheral circuit 120 to apply a precharge voltage to bit lines coupled to the selected memory cells during a read operation, and apply a read voltage to a selected word line coupled to the selected memory cells. During the read operation, a plurality of pieces of logical page data stored in the selected memory cells may be sensed by the first to m-th page buffers PB1 to PBm.

The operation controller 131 may receive a data output command that requests a plurality of pieces of logical page data from the memory controller 200. The operation controller 131 may control the first to m-th page buffers PB1 to PBm so that the plurality of pieces of logical page data sensed by the first to m-th page buffers PB1 to PBm are output to the data input/output circuit 124. In an embodiment, the operation controller 131 may output a latch select signal for selecting some of a plurality of latches included in the first to m-th page buffers PB1 to PBm. The logical page data sensed by the latches selected from among the plurality of latches in response to the latch select signal may be output to the data input/output circuit 124.

The operation controller 131 may provide the data input/output circuit 124 with the input/output signal IOSIG for outputting the plurality of pieces of logical page data to the memory controller 200. The data input/output circuit 124 may provide the plurality of pieces of logical page data to the memory controller 200 in response to the input/output signal IOSIG.

In an embodiment, the operation controller 131 may receive a program command, an address, and data from the memory controller 200. The operation controller 131 may control the peripheral circuit 120 to perform a program operation on selected memory cells corresponding to the address among the plurality of memory cells in response to the program command. The program operation may be an operation of storing the data received from the memory controller 200 in the selected memory cells. The data received from the memory controller 200 may include a plurality of pieces of logical page data. The plurality of pieces of logical page data may include LSB page data, CSB page data, and MSB page data.

In an embodiment, the operation controller 131 may provide the input/output signal IOSIG to the data input/output circuit 124 in response to the program command. The data input/output circuit 124 may receive the LSB page data, the CSB page data, or the MSB page data from the memory controller 200 in response to the input/output signal IOSIG. The operation controller 131 may output a latch select signal for selecting some of a plurality of latches included in the first to m-th page buffers PB1 to PBm. Some latches may store the LSB page data, the CSB page data, or the MSB page data received from the data input/output circuit 124 in response to the latch select signal. In an embodiment, when all of the LSB page data, the CSB page data, and the MSB page data are stored in the plurality of latches included in the first to m-th page buffers PB1 to PBm, the operation controller 131 may perform a program operation. During the program operation, the LSB page data, the CSB page data, and the MSB page data that are stored in the plurality of latches may be stored in the selected memory cells.

In an embodiment, the status register 132 may store status information indicating the degree to which the read operation is performed. The status information may be updated under the control of the operation controller 131. In an embodiment, when LSB page data among the LSB page data, the CSB page data, and the MSB page data that are stored in the selected memory cells is sensed by the first to m-th page buffers PB1 to PBm, the status register 132 may store first status information indicating that a sensing operation on the LSB page data has been completed. In an embodiment, when the CSB page data stored in the selected memory cells is sensed by the first to m-th page buffers PB1 to PBm, the status register 132 may store second status information indicating that a sensing operation on the CSB page data has been completed. In an embodiment, when the MSB page data stored in the selected memory cells is sensed by the first to m-th page buffers PB1 to PBm, the status register 132 may store third status information indicating that a sensing operation on the MSB page data has been completed. The status information St_info stored in the status register 132 may be provided to the memory controller 200 in response to a status read command received from the memory controller 200.

In an embodiment, the ready/busy signal generator 133 may output a signal, indicating whether the memory device is performing a read operation or a program operation, to the memory controller 200. In an embodiment, when the memory device is performing the read operation or the program operation, the ready/busy signal generator 133 may output a busy signal to the memory controller 200. In an embodiment, when the memory device is performing neither a read operation nor a program operation, the ready/busy signal generator 133 may output a ready signal to the memory controller 200. The ready/busy signal generator 133 may output the ready signal or the busy signal to the memory controller 200 based on operation information provided from the operation controller 131.

The memory controller 200 may control the overall operation of the memory system 50.

The memory controller 200 may control the memory device 100 so that a program operation, a read operation or an erase operation is performed in response to a request received from the host 300. The memory controller 200 may provide a command, a physical address, or data to the memory device 100 depending on the program operation, the read operation or the erase operation.

In an embodiment, the memory controller 200 may internally generate a command, an address, and data regardless of whether a request from the host 300 is received, and may transmit them to the memory device 100. For example, the memory controller 200 may provide the memory device 100 with commands, addresses, and data required in order to perform a read operation and a program operation that are involved in performing wear leveling, read reclaim, garbage collection, etc.

In an embodiment, the memory controller 200 may provide the memory device 100 with a read command that instructs respective sensing operations on the LSB page data, the CSB page data, and the MSB page data that are stored in the selected memory cells to be successively performed. The sensing operation may be an operation of storing any one of the LSB page data, the CSB page data, and the MSB page data, stored in the selected memory cells, in the first to m-th page buffers PB1 to PBm.

In an embodiment, the memory controller 200 may provide a status read command that requests status information while the memory device 100 is performing a read operation. The memory controller 200 may provide a data output command based on the status information provided from the memory device 100. In an embodiment, when the first status information, indicating that the sensing operation on the LSB page data has been completed, is received from the memory device 100, the memory controller 200 may provide an LSB page data output command that requests the LSB page data. The memory device 100 may provide the LSB page data to the memory controller 200 in response to the LSB page data output command.

In an embodiment, the memory controller 200 may provide the memory device 100 with a program command that instructs the LSB page data, the CSB page data, and the MSB page data to be stored in the selected memory cells. The memory controller 200 may provide the LSB page data, the CSB page data, and the MSB page data, together with the program command, to the memory device 100. When all of the LSB page data, the CSB page data, and the MSB page data are received, the memory device 100 may perform a program operation.

The host 300 may communicate with the memory system 50 using various communication schemes.

Figure 2:
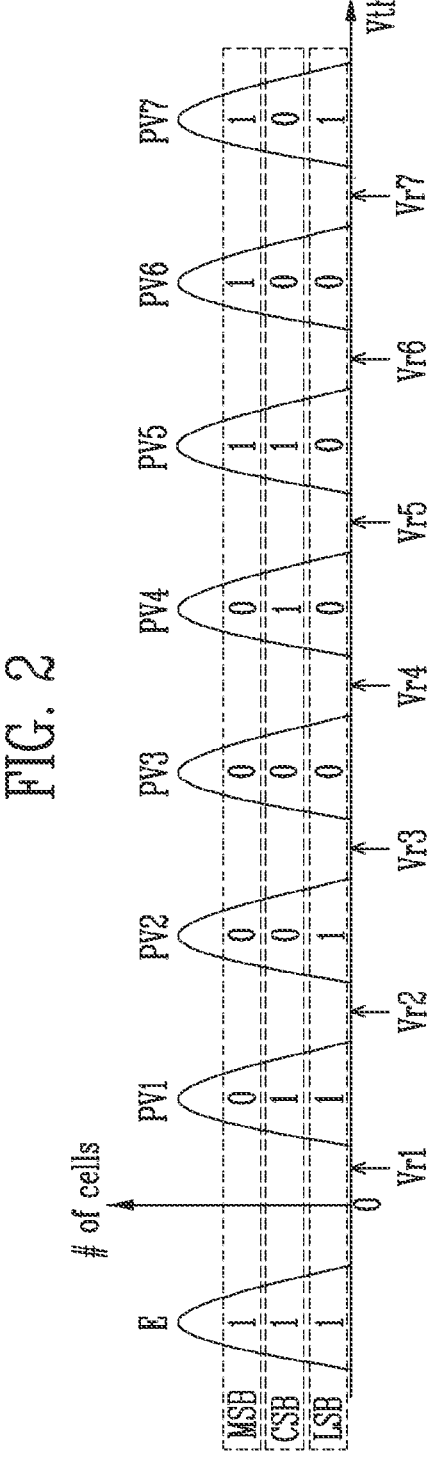
FIG. 2 is a diagram illustrating an embodiment of a read operation depending on threshold voltage distributions of memory cells.

FIG. 2 is a diagram illustrating a read operation depending on threshold voltage distributions of memory cells.

In FIG. 2, the horizontal axis of a graph indicates threshold voltages Vth of memory cells, and the vertical axis thereof indicates the number of memory cells (# of cells).

In FIG. 2, description will be made based on the case where memory cells are programmed according to a TLC scheme in which three bits of data are stored in one memory cell by way of example. Referring to FIG. 2, the threshold voltage of each of memory cells coupled to one word line may be increased to a threshold voltage corresponding to any one of an erase state E and first to seventh program states PV1 to PV7 through a program operation. The data stored in the memory cells may vary depending on the program states of the memory cells. In detail, different pieces of data may be stored in the memory cells depending on whether the threshold voltage of each memory cell corresponds to any of the erase state E and the first to seventh program states PV1 to PV7.

In an embodiment, the memory device 100 may perform a read operation of reading a plurality of pieces of logical page data stored in the memory cells using a plurality of read voltages. The plurality of pieces of logical page data may include LSB page data, CSB page data, and MSB page data. The plurality of read voltages may include first to seventh read voltages Vr1 to Vr7. The first to seventh read voltages Vr1 to Vr7 may be voltages for distinguishing the erase state E and the first to seventh program states PV1 to PV7 from each other.

In an embodiment, the memory device 100 may read the LSB page data stored in memory cells using the third read voltage Vr3 for distinguishing the erase state E and the first and second program states PV1 and PV2 from the third to seventh program states PV3 to PV7, and the seventh read voltage Vr7 for distinguishing the erase state E and the first to sixth program states PV1 to PV6 from the seventh program state PV7. In an embodiment, the memory device 100 may read the CSB page data stored in the memory cells using the second read voltage Vr2, the fourth read voltage Vr4, and the sixth read voltage Vr6. In an embodiment, the memory device 100 may read the MSB page data stored in the memory cells using the first read voltage Vr1 and the fifth read voltage Vr5.

Figure 3:
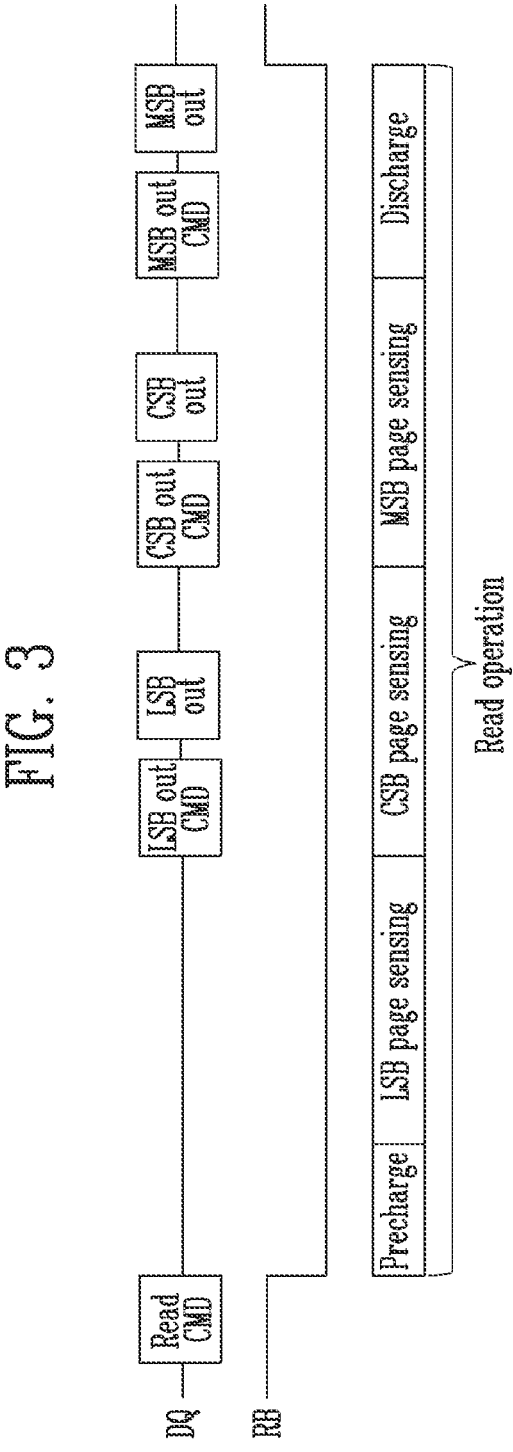
FIG. 3 is a diagram illustrating an embodiment of a read operation of a memory device.

FIG. 3 is a diagram illustrating a read operation of a memory device.

Referring to FIG. 3, the memory device 100 may receive a read command Read CMD from the memory controller 200 through a data input/output line DQ. The memory device 100 may successively perform respective sensing operations on the LSB page data, the CSB page data, and the MSB page data that are stored in selected memory cells among the plurality of memory cells in response to the read command Read CMD.

In an embodiment, the read operation may include a precharge period (Precharge), an LSB page sensing period (LSB page sensing), a CSB page sensing period (CSB page sensing), an MSB page sensing period (MSB page sensing), and a discharge period (Discharge). The memory device 100 may output a busy signal to the memory controller 200 through a ready/busy line RB while performing a read operation. The busy signal may correspond to a logic low state. The ready signal may correspond to a logic high state.

The precharge period (Precharge) may be a period during which the voltages of bit lines coupled to selected memory cells are precharged.

The LSB page sensing period (LSB page sensing) may be a period during which LSB page data stored in the selected memory cells is sensed by the plurality of page buffers. In an embodiment, the memory device may sense LSB page data by sequentially applying a third read voltage and a seventh read voltage among a plurality of read voltages to a selected word line coupled to the selected memory cells.

The CSB page sensing period (CSB page sensing) may be a period during which CSB page data stored in the selected memory cells is sensed by the plurality of page buffers. The memory device 100 may receive an LSB page data output command LSB out CMD from the memory controller 200 while sensing the CSB page data. Because the LSB page data is sensed by the plurality of page buffers, the memory device 100 may provide the LSB page data to the memory controller 200 through the data input/output line DQ in response to the LSB page data output command LSB out CMD (LSB out). The memory device 100 may provide the LSB page data to the memory controller 200 while sensing the CSB page data.

The MSB page sensing period (MSB page sensing) may be a period during which MSB page data stored in the selected memory cells is sensed by the plurality of page buffers. The memory device 100 may receive a CSB page data output command CSB out CMD from the memory controller 200 while sensing the MSB page data. Because the CSB page data is sensed by the plurality of page buffers, the memory device 100 may provide the CSB page data to the memory controller 200 through the data input/output line DQ in response to the CSB page data output command CSB out CMD (CSB out). The memory device 100 may provide the CSB page data to the memory controller 200 while sensing the MSB page data.

The discharge period (Discharge) may be a period during which voltages supplied to the selected word line and bit lines coupled to the selected memory cells are discharged. The memory device 100 may receive an MSB page data output command MSB out CMD from the memory controller 200 while discharging the voltages of the selected word line and the bit lines. Because the MSB page data is sensed by the plurality of page buffers, the memory device 100 may provide the MSB page data to the memory controller 200 through the data input/output line DQ in response to the MSB page data output command MSB out CMD (MSB out). The memory device 100 may provide the MSB page data to the memory controller 200 while discharging the voltages of the selected word line and the bit lines.

Meanwhile, a comparative memory controller may individually provide an LSB page read command for reading LSB page data, a CSB page read command for reading CSB page data, and an MSB page read command for reading MSB page data to the memory device. In the comparative example, because a precharge period, a page sensing period, and a discharge period are included in the read operation corresponding to each of the page read commands, the time required for the read operation of the memory device may be lengthened.

On the other hand, according to the embodiment of the present disclosure, the memory controller provides one read command that instructs LSB page data, CSB page data, and MSB page data to be successively sensed to the memory device, thus reducing the time required to precharge the voltages of bit lines or to discharge the voltages of the word line and the bit lines.

Figure 4:
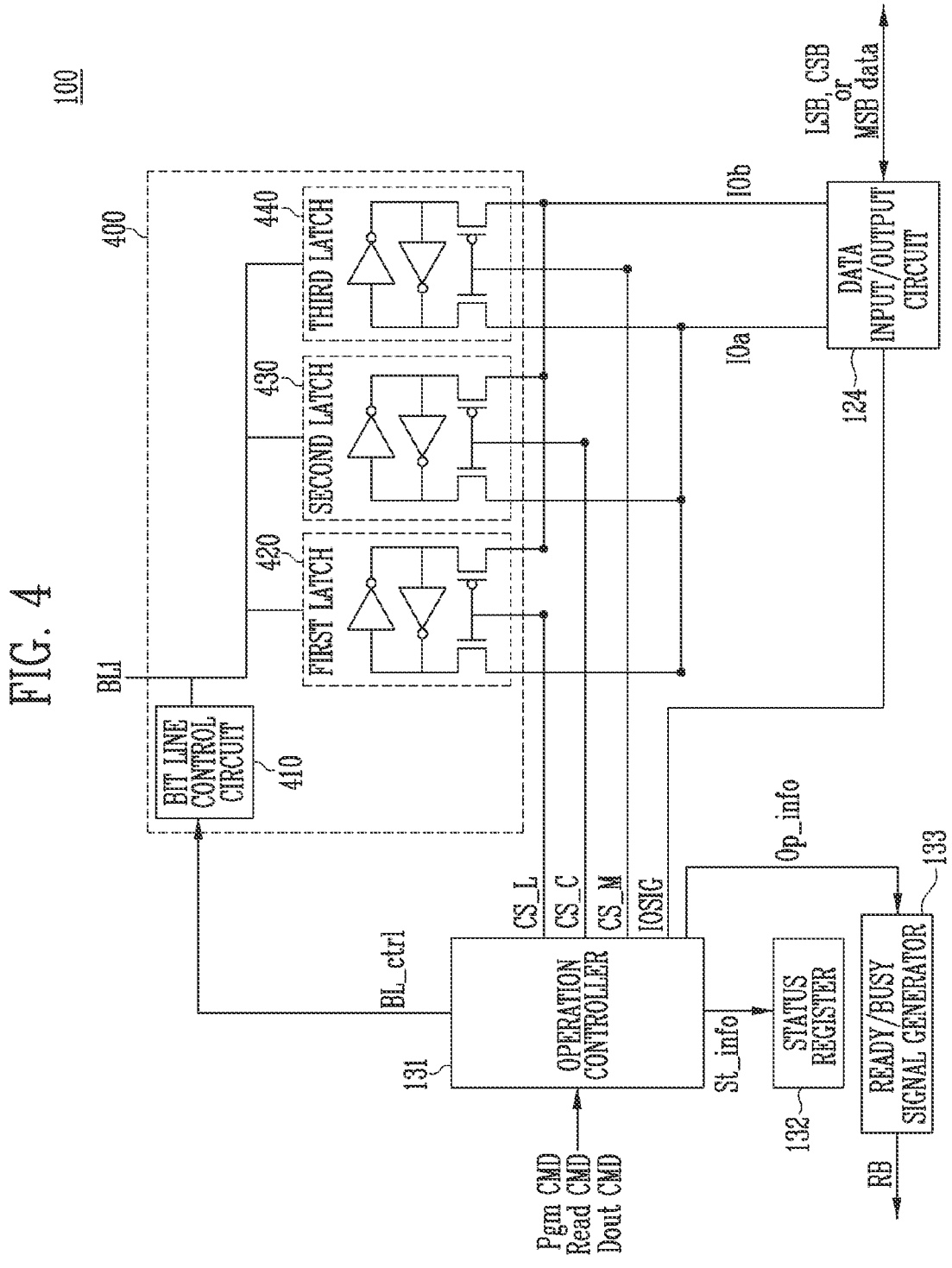
FIG. 4 is a diagram illustrating an embodiment of a sensing operation and a data input/output operation.

FIG. 4 is a diagram illustrating a sensing operation and a data input/output operation.

Referring to FIG. 4, the memory device 100 may include an operation controller 131, a status register 132, a ready/busy signal generator 133, a data input/output circuit 124, and a first page buffer 400. The first page buffer 400 may be any one of first to m-th page buffers PB1 to PBm illustrated in FIG. 1.

In an embodiment, the first page buffer 400 may include a bit line control circuit 410, a first latch 420, a second latch 430, and a third latch 440. The first page buffer 400 may be coupled to a first bit line BL1. The first bit line BL1 may be coupled to a memory cell.

The number of latches included in the first page buffer 400 may be changed depending on the number of bits stored in one memory cell. In an embodiment, when one memory cell is a triple-level cell which stores three bits of data, the first page buffer 400 may include three latches, such as the first latch 420, the second latch 430, and the third latch 440. In FIG. 4, the case where the memory cell is the triple-level cell is described by way of example.

The bit line control circuit 410 may precharge or discharge the voltage of the bit line under the control of the operation controller 131.

The first latch 420, the second latch 430, and the third latch 440 may store LSB data, CSB data, and MSB data sensed from the memory cell, respectively.

The first latch 420 may be coupled to the operation controller 131 through a first latch select line CS_L. The second latch 430 may be coupled to the operation controller 131 through a second latch select line CS_C. The third latch 440 may be coupled to the operation controller 131 through a third latch select line CS_M.

Each of the first latch 420, the second latch 430, and the third latch 440 may be coupled to the data input/output circuit 124 through a first IO line IOa and a second IO line IOb. In an embodiment, the first latch 420, the second latch 430, and the third latch 440 may share the first IO line IOa and the second IO line IOb. In other embodiments, apart from the embodiment illustrated in FIG. 4, the first latch 420, the second latch 430, and the third latch 440 may be coupled to the data input/output circuit 124 through respective IO lines.

In an embodiment, the operation controller 131 may receive a read command Read CMD from the memory controller 200. The operation controller 131 may control a read operation performed on a memory cell coupled to the first bit line BL1 in response to the read command Read CMD. The operation controller 131 may provide operation information Op_info, indicating that the read operation is being performed, to the ready/busy signal generator 133. The ready/busy signal generator 133 may output a busy signal to the memory controller 200 through a ready/busy line RB based on the operation information Op_info.

For example, the operation controller 131 may control the bit line control circuit 410 to precharge the voltage of the first bit line BL1. The operation controller 131 may provide a bit line control signal BL_ctrl to precharge the voltage of the first bit line BL1 to the bit line control circuit 410. The bit line control circuit 410 may precharge the voltage of the first bit line BL1 in response to the bit line control signal BL_ctrl.

Thereafter, the operation controller 131 may control the first page buffer 400 so that LSB data, CSB data, and MSB data, stored in the memory cell, are respectively sensed by the first latch 420, the second latch 430, and the third latch 440 through the first bit line BL1. In an embodiment, the LSB data, the CSB data, and the MSB data, stored in the memory cell, are sequentially sensed by the first latch 420, the second latch 430, and the third latch 440.

In an embodiment, when the LSB data stored in the memory cell is sensed by the first latch 420, the MSB data may be sensed by the second latch 430. In an embodiment, after the LSB data stored in the memory cell is sensed by the first latch 420, the operation controller 131 may provide first status information to the status register 132. The first status information may be information indicating that a sensing operation on the LSB data has been completed. The first status information may be provided to the memory controller 200 in response to a status read command.

After the LSB data is sensed by the first latch 420, the operation controller 131 may receive an LSB page data output command that requests the LSB data from the memory controller 200. The operation controller 131 may activate a first latch select signal for selecting the first latch 420 by which the LSB data is sensed in response to the LSB page data output command. The first latch select signal may be provided to the first latch 420 through the first latch select line CS_L.

The first latch 420 may provide the LSB data to the data input/output circuit 124 through the first IO line IOa and the second IO line IOb in response to the first latch select signal. The data input/output circuit 124 may output the LSB data to the memory controller 200 in response to an input/output signal IOSIG provided from the operation controller 131. The LSB data sensed by the first latch 420 may be provided to the memory controller 200 through the data input/output circuit 124 while the CSB data stored in the memory cell is sensed by the second latch 430.

In an embodiment, when the CSB data stored in the memory cell is sensed by the second latch 430, the MSB data may be sensed by the third latch 440. In an embodiment, after the CSB data stored in the memory cell is sensed by the second latch 430, the operation controller 131 may provide second status information to the status register 132. The second status information may be information indicating that a sensing operation on the CSB data has been completed. The second status information stored in the status register 132 may be provided to the memory controller 200 in response to a status read command.

After the CSB data is sensed by the second latch 430, the operation controller 131 may receive a CSB page data output command that requests the CSB data from the memory controller 200. The operation controller 131 may activate a second latch select signal for selecting the second latch 430 by which the CSB data is sensed in response to the CSB page data output command. The second latch select signal may be provided to the second latch 430 through the second latch select line CS_C.

The second latch 430 may provide the CSB data to the data input/output circuit 124 through the first IO line IOa and the second IO line IOb in response to the second latch select signal. The data input/output circuit 124 may output the CSB data to the memory controller 200 in response to the input/output signal IOSIG provided from the operation controller 131. The CSB data sensed by the second latch 430 may be provided to the memory controller 200 through the data input/output circuit 124 while the MSB data stored in the memory cell is sensed by the third latch 440.

In an embodiment, when the MSB data stored in the memory cell is sensed by the third latch 440, the voltage of the first bit line may be discharged. In an embodiment, when the MSB data is sensed by the third latch 440, the operation controller 131 may provide a bit line control signal BL_ctrl for discharging the voltage of the first bit line BL1 to the bit line control circuit 410. The bit line control circuit 410 may discharge the voltage of the first bit line BL1 in response to the bit line control signal BL_ctrl.

In an embodiment, after the MSB data stored in the memory cell is sensed by the third latch 440, the operation controller 131 may provide third status information to the status register 132. The third status information may be information indicating that a sensing operation on the MSB data has been completed. The third status information stored in the status register 132 may be provided to the memory controller 200 in response to a status read command.

After the MSB data is sensed by the third latch 440, the operation controller 131 may receive an MSB page data output command that requests the MSB data from the memory controller 200. The operation controller 131 may activate a third latch select signal for selecting the third latch 440 by which the MSB data is sensed in response to the MSB page data output command. The third latch select signal may be provided to the third latch 440 through the third latch select line CS_M.

The third latch 440 may provide the MSB data to the data input/output circuit 124 through the first IO line IOa and the second IO line IOb in response to the third latch select signal. The data input/output circuit 124 may output the MSB data to the memory controller 200 in response to the input/output signal IOSIG provided from the operation controller 131. The MSB data sensed by the third latch 440 may be provided to the memory controller 200 through the data input/output circuit 124 while the voltage of the first bit line BL1 is discharged.

After the voltage of the first bit line BL1 is discharged, the operation controller 131 may provide operation information Op_info, indicating that the read operation has been completed, to the ready/busy signal generator 133. The ready/busy signal generator 133 may output a ready signal to the memory controller 200 through the ready/busy line RB based on the operation information Op_info.

Meanwhile, referring to a comparative example, only one of the first to third latches 420, 430, and 440 was coupled to the operation controller 131 through a latch select line. For example, in the comparative example, when only the third latch 440 is coupled to the operation controller 131 through the latch select line, the LSB data needed to be stored from the first latch 420 in the third latch 440 in order to output the LSB data stored in the first latch 420 to the memory controller 200, after which the LSB data stored in the third latch 440 needed to be output to the memory controller 200 through the data input/output circuit 124. Further, in order to output the CSB data stored in the second latch 430 to the memory controller 200, the CSB data needed to be stored from the second latch 430 in the third latch 440, after which the CSB data stored in the third latch 440 needed to be output to the memory controller 200 through the data input/output circuit 124. That is, in the comparative example, prior to outputting data to the memory controller 200, data transfer between latches for transmitting data stored in any one latch to another latch was essentially required.

However, the memory device 100 according to an embodiment of the present disclosure has a structure in which the first to third latch select lines CS_L, CS_C, and CS_M are coupled to the first to third latches 420, 430, and 440, respectively, and the first to third latches 420, 430, and 440 are respectively selected through the first to third latch select signals, thus enabling the LSB data, the CSB data, and the MSB data respectively stored in the first, second, and third latches 420, 430, and 440 to be directly output to the memory controller 200 through the data input/output circuit 124 without requiring data transfer between the latches.

Furthermore, the memory device 100 according to an embodiment of the present disclosure may respectively select the first to third latches 420, 430, and 440 using the first to third latch select signals even during a program operation of storing data in selected memory cells among the plurality of memory cells.

For example, the memory device 100 may receive a program command Pgm CMD and LSB data from the memory controller 200. In an embodiment, the operation controller 131 may activate the input/output signal IOSIG in response to the program command Pgm CMD. The data input/output circuit 124 may receive the LSB data in response to the input/output signal IOSIG. Also, the operation controller 131 may output a first latch select signal for selecting the first latch 420 among the first to third latches 420, 430, and 440 through the first latch select line CS_L. The first latch 420 may store the LSB data received from the data input/output circuit 124 in response to the first latch select signal.

Thereafter, the memory device 100 may receive a program command Pgm CMD and CSB data. The program command Pgm CMD may be provided to the operation controller 131, and the CSB data may be provided to the data input/output circuit 124. The operation controller 131 may output a second latch select signal for selecting the second latch 430 among the first to third latches 420, 430, and 440 through the second latch select line CS_C in response to the program command Pgm CMD. The second latch 430 may store the CSB data received from the data input/output circuit 124 in response to the second latch select signal.

Thereafter, the memory device 100 may receive a program command Pgm CMD and MSB data. The program command Pgm CMD may be provided to the operation controller 131, and the MSB data may be provided to the data input/output circuit 124. The operation controller 131 may output a third latch select signal for selecting the third latch 440 among the first to third latches 420, 430, and 440 through the third latch select line CS_M in response to the program command Pgm CMD. The third latch 440 may store the MSB data received from the data input/output circuit 124 in response to the third latch select signal.

After the LSB data, the CSB data, and the MSB data are respectively stored in the first to third latches, the operation controller 131 may control a program operation of programming the memory cell coupled to the first bit line BL1. During the program operation, the LSB data, the CSB data, and the MSB data may be stored in the memory cell coupled to the first bit line BL1.

In an embodiment, the LSB data, the CSB data, and the MSB data may be stored in the first latch 420, the second latch 430, and the third latch 440, respectively, without requiring data transfer between the latches even during the program operation.

Figure 5:
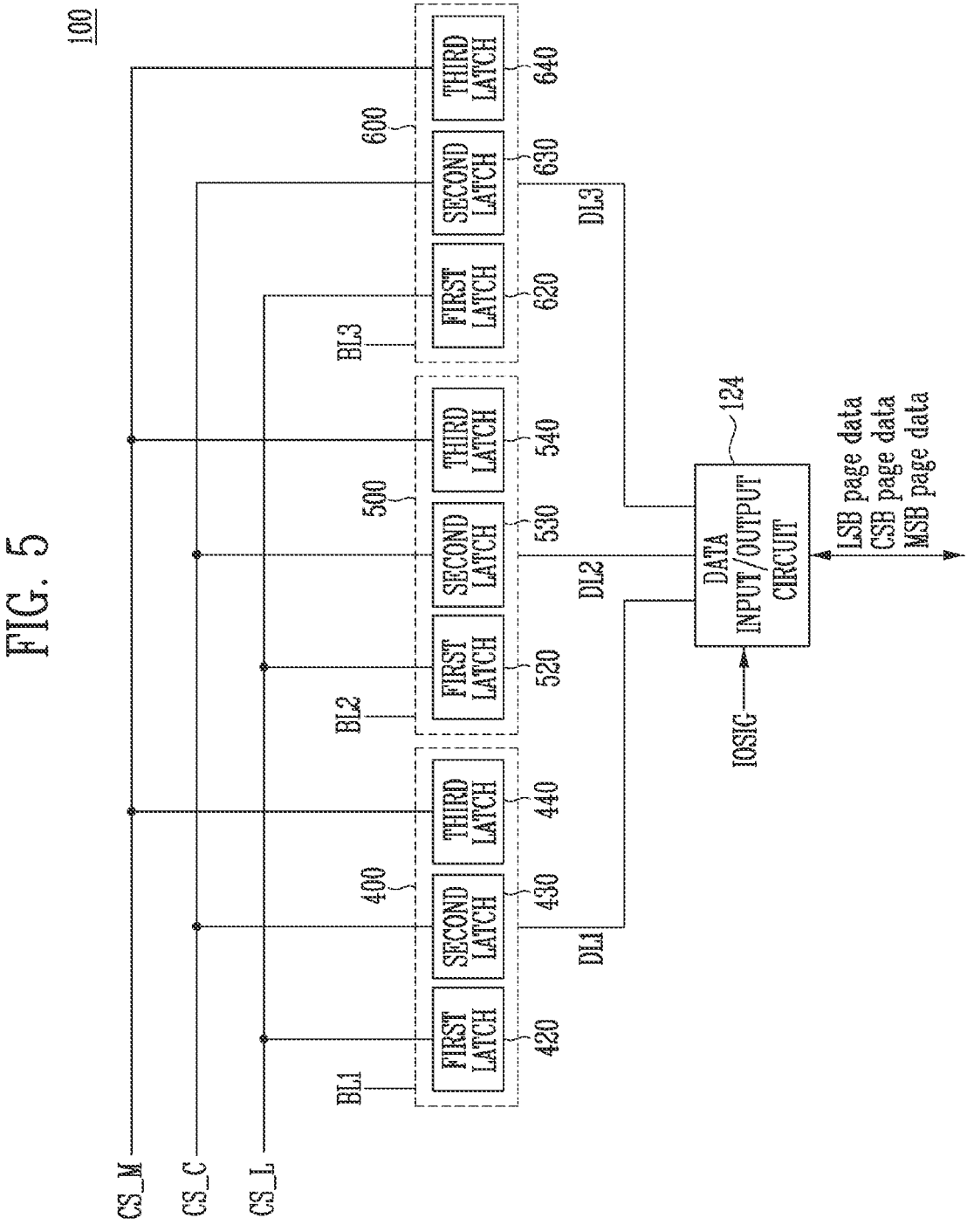
FIG. 5 is a diagram illustrating an embodiment of an operation of inputting/outputting a plurality of pieces of logical page data.

FIG. 5 is a diagram illustrating an operation of inputting/outputting a plurality of pieces of logical page data.

Repeated descriptions of configuration identical to that of FIG. 4 will be omitted in FIG. 5. Further, in FIG. 5, the case where the memory device 100 includes three page buffers will be described by way of example. In FIG. 5, the data output operation to be described below may be equally applied to the case where the number of page buffers is less than or greater than 3.

Referring to FIG. 5, the memory device 100 may include a first page buffer 400, a second page buffer 500, and a third page buffer 600. The first page buffer 400 may be coupled to a first bit line BL1. The second page buffer 500 may be coupled to a second bit line BL2. The third page buffer 600 may be coupled to a third bit line BL3.

Each of the first page buffer 400, the second page buffer 500, and the third page buffer 600 may include a first latch 420, 520 or 620, a second latch 430, 530 or 630, and a third latch 440, 540 or 640.

For example, during a read operation, each of the first latches 420, 520, and 620 may sense LSB data. The first latches may refer to the first latch 420 of the first page buffer, the first latch 520 of the second page buffer, and the first latch 620 of the third page buffer. The LSB data sensed by the first latches 420, 520, and 620 may form LSB page data.

The first latches 420, 520, and 620 may receive a first latch select signal through a first latch select line CS_L. The LSB page data sensed by the first latches 420, 520, and 620 may be provided to the data input/output circuit 124 through the first to third data lines DL1 to DL3 in response to the first latch select signal. The data input/output circuit 124 may output the LSB page data to the memory controller 200 in response to an input/output signal IOSIG.

In an embodiment, the first data line DL1 may include the first IO line IOa and the second IO line IOb of FIG. 4. Similar to the first data line DL1, each of the second and third data lines DL2 and DL3 may include a first IO line IOa and a second IO line IOb.

In an embodiment, each of the second latches 430, 530, and 630 may sense CSB data. The second latches may refer to the second latch 430 of the first page buffer, the second latch 530 of the second page buffer, and the second latch 630 of the third page buffer. The CSB data sensed by the second latches 430, 530, and 630 may form CSB page data.

The second latches 430, 530, and 630 may receive a second latch select signal through a second latch select line CS_C. The CSB page data sensed by the second latches 430, 530, and 630 may be provided to the data input/output circuit 124 in response to the second latch select signal. The data input/output circuit 124 may output the CSB page data to the memory controller 200 in response to an input/output signal IOSIG.

In an embodiment, each of the third latches 440, 540, and 640 may sense MSB data. The third latches may refer to the third latch 440 of the first page buffer, the third latch 540 of the second page buffer, and the third latch 640 of the third page buffer. The MSB data sensed by the third latches 440, 540, and 640 may form MSB page data.

The third latches 440, 540, and 640 may receive a third latch select signal through a third latch select line CS_M. The MSB page data sensed by the third latches 440, 540, and 640 may be provided to the data input/output circuit 124 in response to the third latch select signal. The data input/output circuit 124 may output the MSB page data to the memory controller 200 in response to an input/output signal IOSIG.

Next, the operation of the memory device 100 performed during a program operation will be described below. In detail, during the program operation, the data input/output circuit 124 may receive LSB page data from the memory controller 200. In an embodiment, the data input/output circuit 124 may store the LSB page data in response to the input/output signal IOSIG. The first latches 420, 520, and 620 may receive a first latch select signal through the first latch select line CS_L. The LSB page data stored in the data input/output circuit 124 may be provided to the first latches 420, 520, and 620 in response to the first latch select signal. In other words, the first latches 420, 520, and 620 may store the LSB page data received from the data input/output circuit 124 in response to the first latch select signal.

Thereafter, the data input/output circuit 124 may receive CSB page data from the memory controller 200. After the CSB page data is stored in the data input/output circuit 124, the second latches 430, 530, and 630 may receive the second latch select signal through the second latch select line CS_C. The second latches 430, 530, and 630 may store CSB page data received from the data input/output circuit 124 in response to the second latch select signal.

Thereafter, the data input/output circuit 124 may receive MSB page data from the memory controller 200. After the MSB page data is stored in the data input/output circuit 124, the third latches 440, 540, and 640 may receive a third latch select signal through the third latch select line CS_M. The third latches 440, 540, and 640 may store MSB page data received from the data input/output circuit 124 in response to the third latch select signal.

After the LSB page data, the CSB page data, and the MSB page data are stored in the first latches 420, 520, and 620, the second latches 430, 530, and 630, and the third latches 440, 540, and 640, a program operation may be performed.

Figure 6:
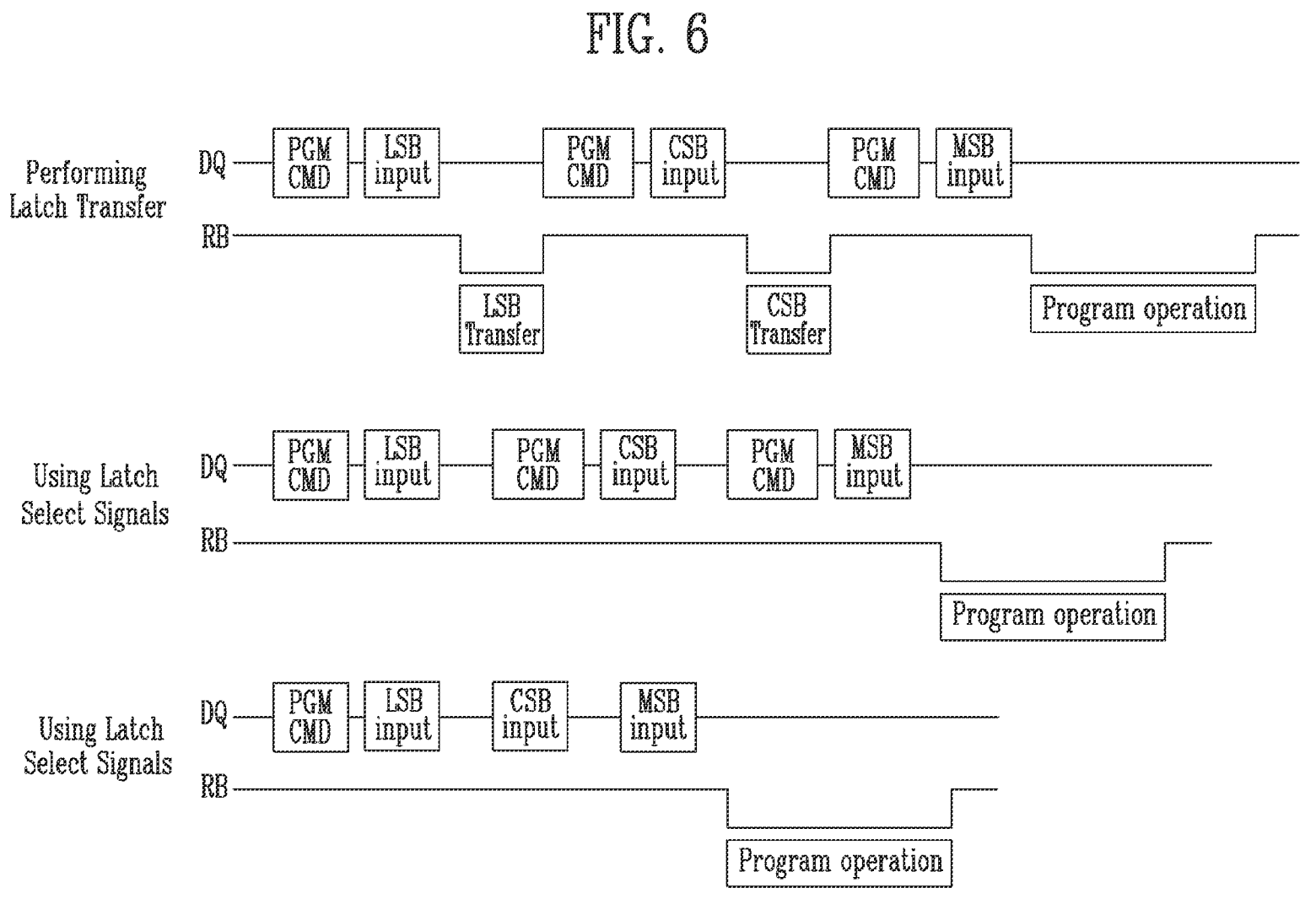

FIG. 6 is a diagram illustrating an operation of receiving data during a program operation.

First, the case where data transfer between latches, illustrated in the upper portion of FIG. 6, is performed (Performing Latch Transfer) will be described in detail below. The memory device 100 may receive a program command PGM CMD and LSB data from the memory controller 200 through a data input/output line DQ. The memory device 100 may store the LSB data in the third latch 440 illustrated in FIG. 4, and thereafter store the LSB data in the first latch 420 (LSB Transfer).

After the LSB data is stored in the first latch 420, the memory device 100 may receive a program command PGM CMD and CSB data. The memory device 100 may store the CSB data in the third latch 440 illustrated in FIG. 4, and thereafter store the CSB data in the second latch 430. After the CSB data is stored in the second latch 430, the memory device 100 may receive a program command PGM CMD and MSB data.

After the MSB data is stored in the third latch 440, the memory device 100 may perform a program operation using the LSB data, the CSB data, and the MSB data.

As described above with reference to FIGS. 4 and 5, unless latch select lines are coupled to the latches, respectively, and the latches are respectively selected through latch select signals, data transfer between the latches may be essential. Therefore, because the memory device 100 needs to perform data transfer between the latches while receiving the LSB data, the CSB data, and the MSB data from the memory controller 200, the time during which the LSB data, the CSB data, and the MSB data are received may be lengthened.

Next, the case where the latch select signals are used, illustrated in the middle portion of FIG. 6 (Using Latch Select Signals), will be described in detail below. The memory device 100 may receive a program command PGM CMD and LSB data through the data input/output line DQ. The memory device 100 may activate a first latch select signal for selecting the first latch 420 among the first to third latches 420, 430, and 440 illustrated in FIG. 4. The LSB data may be stored in the first latch 420 in response to the first latch select signal. That is, the LSB data may be stored in the first latch 420 without passing through the third latch 440. The memory device 100 may receive the program command PGM CMD and CSB data. The memory device 100 may activate a second latch select signal for selecting the second latch 430 among the first to third latches 420, 430, and 440 illustrated in FIG. 4. The CSB data may be stored in the second latch 430 in response to the second latch select signal. That is, the CSB data may be stored in the second latch 430 without passing through the third latch 440.

The memory device 100 may receive a program command PGM CMD and MSB data. The memory device 100 may activate a third latch select signal for selecting the third latch 440 among the first to third latches 420, 430, and 440 illustrated in FIG. 4. The MSB data may be stored in the third latch 440 in response to the third latch select signal. The memory device 100 may perform a program operation using the LSB data, the CSB data, and the MSB data.

Next, an embodiment of the case where latch select signals are used, illustrated in the lower portion of FIG. 6 (Using Latch Select Signals), will be described in detail below. Apart from the case illustrated in the middle portion of FIG. 6, the memory device 100 may sequentially receive LSB data, CSB data, and MSB data through one program command PGM CMD. The memory device 100 may receive the LSB data and thereafter activate the first latch select signal to store the LSB data in the first latch 420, may receive the CSB data and thereafter activate the second latch select signal to store the CSB data in the second latch 430, and may receive the MSB data and thereafter activate the third latch select signal to store the MSB data in the third latch 440. After the LSB data, the CSB data, and the MSB data are stored in the first to third latches 420, 430, and 440, the memory device 100 may perform a program operation.

Figure 7:
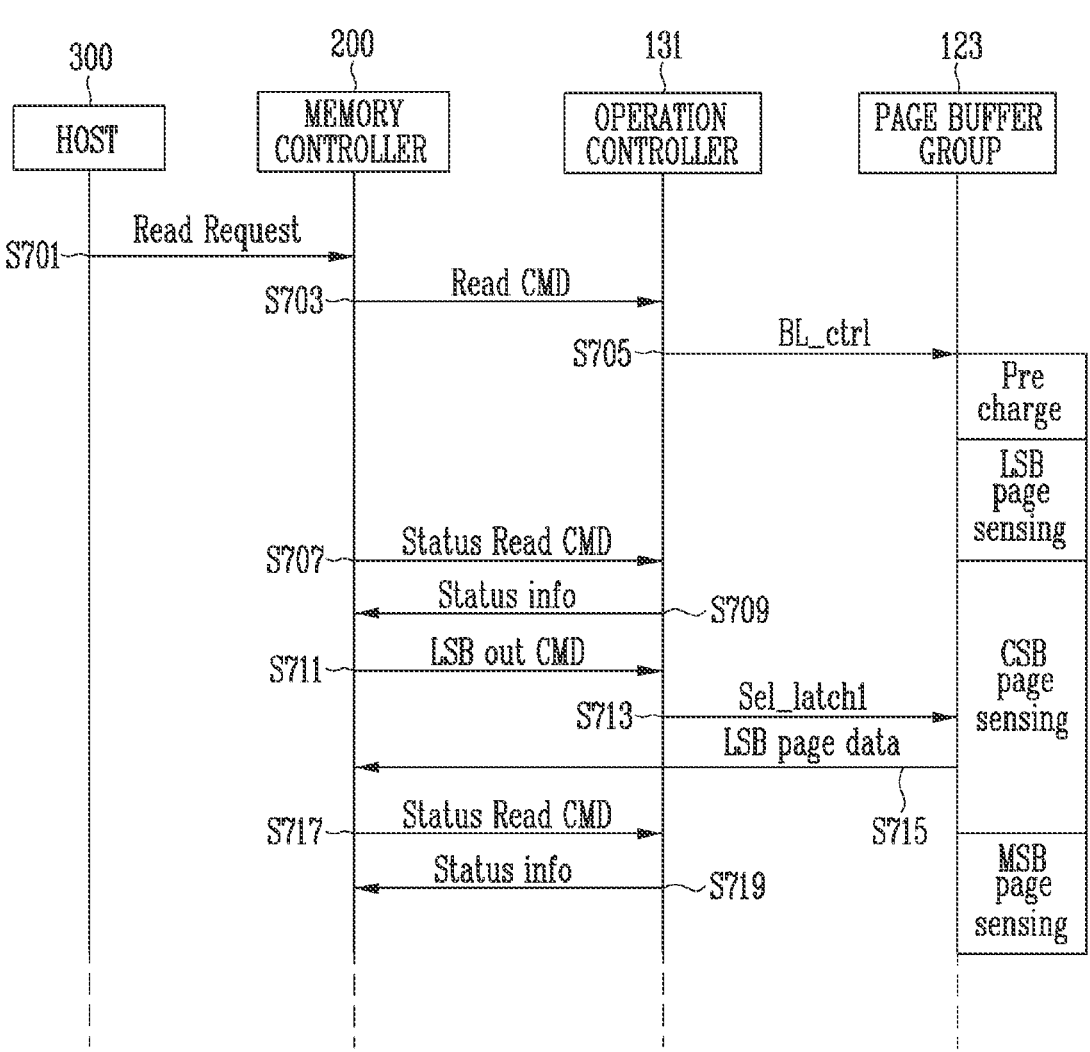
FIGS. 7 and 8 are diagrams illustrating an embodiment of a read operation of a memory system.
Figure 8:
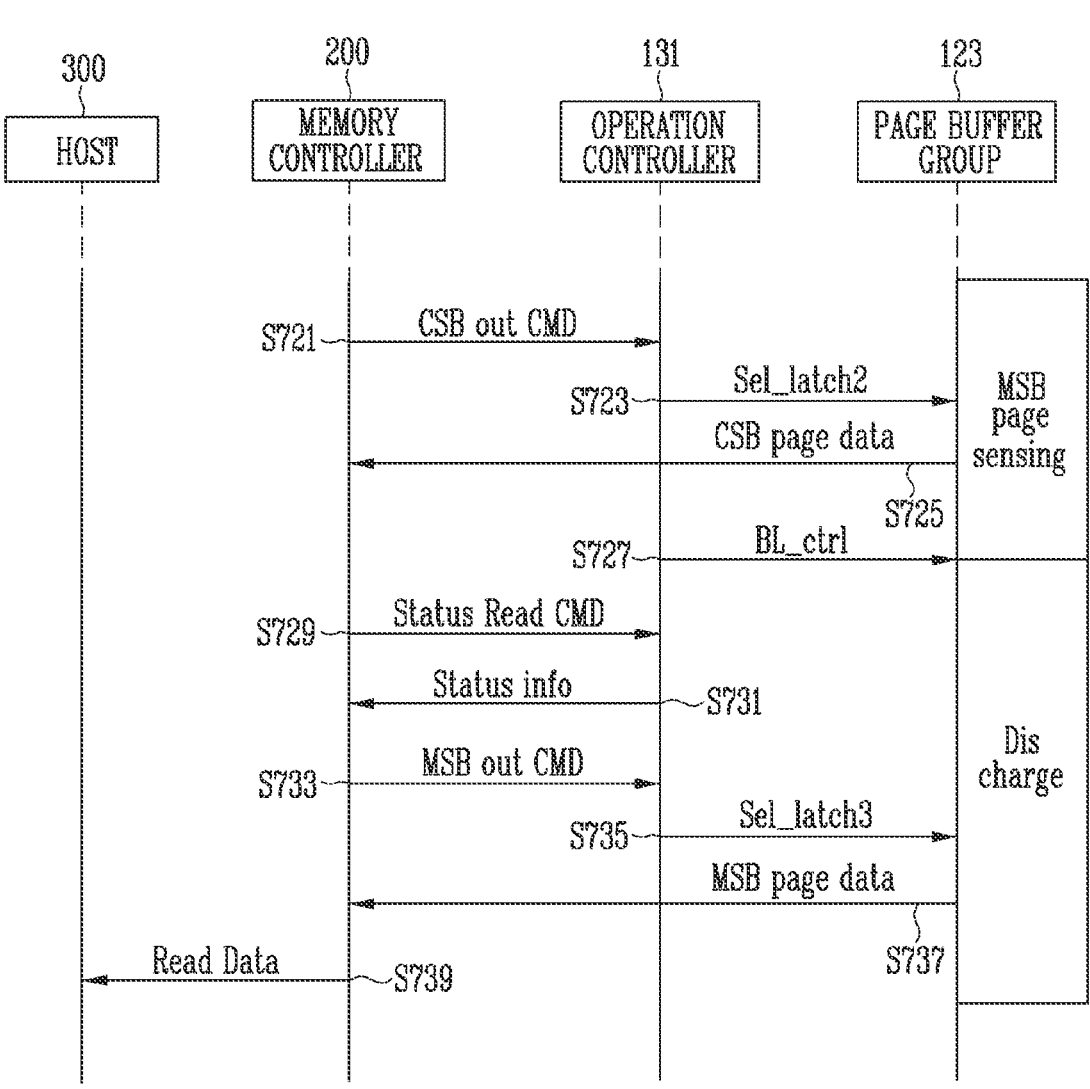

FIGS. 7 and 8 are diagrams illustrating a read operation of a memory system.

First, referring to FIG. 7, at step S701, the memory controller 200 may receive a read request from the host 300.

At step S703, the memory controller 200 may provide a read command Read CMD to the operation controller 131. The read command Read CMD may be a command that instructs sensing operations to be successively performed on the LSB page data, the CSB page data, and the MSB page data that are stored in selected memory cells among a plurality of memory cells.

At step S705, the operation controller 131 may provide a bit line control signal BL_ctrl for precharging the voltages of bit lines to the page buffer group 123. The page buffer group 123 may include a plurality of page buffers. After the voltages of the bit lines are precharged, the plurality of page buffers may sense LSB page data stored in the selected memory cells.

At step S707, the memory controller 200 may provide a status read command Status Read CMD to the operation controller 131 while the sensing operation is being performed on the CSB page data (CSB page sensing).

At step S709, the operation controller 131 may provide status information Status Info, indicating whether the sensing operation on the LSB page data has been completed, to the memory controller 200 in response to the status read command Status Read CMD.

At step S711, when the status information, indicating that the sensing operation on the LSB page data has been completed, is received, the memory controller 200 may provide an LSB page data output command LSB out CMD that requests the LSB page data to the operation controller 131. However, unlike the case illustrated FIG. 7, when status information, indicating that the sensing operation on the LSB page data has not been completed, is received, the memory controller 200 may provide again the status read command Status Read CMD to the operation controller 131 after a preset period of time has elapsed.

At step S713, the operation controller 131 may provide a first latch select signal Sel_latch1 for selecting first latches, by which LSB page data is sensed, from among the plurality of latches included in the plurality of page buffers to the page buffer group 123 in response to the LSB page data output command LSB out CMD.

At step S715, the first latches included in the page buffer group may provide the LSB page data to the memory controller 200 in response to the first latch select signal Sel_latch1.

At step S717, the memory controller 200 may provide a status read command Status Read CMD to the operation controller 131 while the sensing operation is being performed on the MSB page data.

At step S719, the operation controller 131 may provide status information Status Info, indicating whether the sensing operation on the CSB page data has been completed, to the memory controller 200 in response to the status read command Status Read CMD.

Next, referring to FIG. 8, at step S721, when status information, indicating that the sensing operation on the CSB page data has been completed, is received, the memory controller 200 may provide a CSB page data output command CSB out CMD that requests the CSB page data to the operation controller 131.

At step S723, the operation controller 131 may provide a second latch select signal Sel_latch2 for selecting second latches, by which the CSB page data is sensed, among the plurality of latches to the page buffer group 123 in response to the CSB page data output command CSB out CMD.

At step S725, the second latches included in the page buffer group may provide the CSB page data to the memory controller 200 in response to the second latch select signal Sel_latch2.

At step S727, after the sensing operation on the MSB page data is performed, the operation controller 131 may provide a bit line control signal BL_ctrl for discharging the voltages of the bit lines to the page buffer group 123.

At step S729, the memory controller 200 may provide a status read command Status Read CMD to the operation controller 131 while the voltages of the bit lines are discharged.

At step S731, the operation controller 131 may provide status information Status Info, indicating whether the sensing operation on the MSB page data has been completed, to the memory controller 200 in response to the status read command Status Read CMD.

At step S733, when the status information, indicating that the sensing operation on the MSB page data has been completed, is received, the memory controller 200 may provide an MSB page data output command MSB out CMD that requests the MSB page data to the operation controller 131.

At step S735, the operation controller 131 may provide a third latch select signal Sel_latch3 for selecting third latches, by which the MSB page data is sensed, among the plurality of latches to the page buffer group 123 in response to the MSB page data output command MSB out CMD.

At step S737, the third latches included in the page buffer group may provide the MSB page data to the memory controller 200 in response to the third latch select signal Sel_latch3.

At step S739, the memory controller 200 may provide read data including the LSB page data, the CSB page data, and the MSB page data to the host 300.

Figure 9:
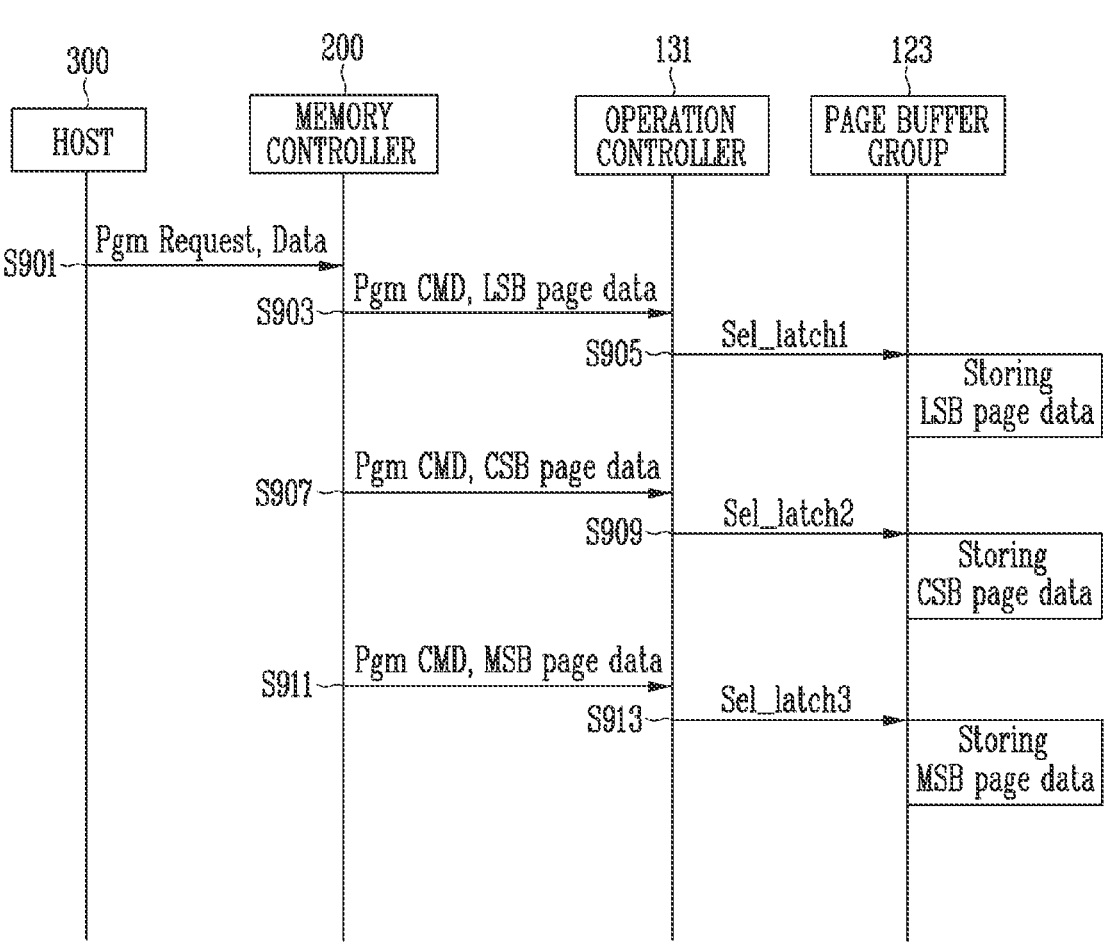
FIG. 9 is a diagram illustrating an embodiment of a program operation of a memory system.

FIG. 9 is a diagram illustrating a program operation of a memory system.

Referring to FIG. 9, at step S901, the memory controller 200 may receive a program request Pgm Request and data from the host 300. The data received from the host 300 may include LSB page data, CSB page data, and MSB page data.

At step S903, the memory controller 200 may provide a program command Pgm CMD and LSB page data to the operation controller 131 in response to the program request Pgm Request. The LSB page data may be stored in the data input/output circuit.

At step S905, the operation controller 131 may provide a first latch select signal Sel_latch1 for selecting first latches among the plurality of latches to the page buffer group 123. The first latches may store the LSB page data received from the data input/output circuit in response to the first latch select signal Sel_latch1.

At step S907, the memory controller 200 may provide a program command Pgm CMD and CSB page data to the operation controller 131. The CSB page data may be stored in the data input/output circuit.

At step S909, the operation controller 131 may provide a second latch select signal Sel_latch2 for selecting second latches among the plurality of latches to the page buffer group 123. The second latches may store the CSB page data received from the data input/output circuit in response to the second latch select signal Sel_latch2.

At step S911, the memory controller 200 may provide a program command Pgm CMD and MSB page data to the operation controller 131. The MSB page data may be stored in the data input/output circuit.

At step S913, the operation controller 131 may provide a third latch select signal Sel_latch3 for selecting third latches among the plurality of latches to the page buffer group 123. The third latches may store the MSB page data received from the data input/output circuit in response to the third latch select signal Sel_latch3.

FIG. 10 is a flowchart illustrating a read operation of a memory device.

Referring to FIG. 10, at step S1001, the memory device 100 may select memory cells corresponding to a read command and an address, which are received from the memory controller, from among a plurality of memory cells.

At step S1003, the memory device 100 may sense first logical page data, among a plurality of pieces of logical page data stored in the selected memory cells, by first latches among a plurality of latches.

At step S1005, the memory device 100 may output the first logical page data stored in the first latches to the memory controller in response to a first latch select signal for selecting the first latches while sensing second logical page data among the plurality of pieces of logical page data by the second latches among the plurality of latches.

At step S1007, the memory device 100 may output the second logical page data stored in the second latches to the memory controller in response to a second latch select signal for selecting the second latches while sensing third logical page data among the plurality of pieces of logical page data by the third latches among the plurality of latches.

At step S1009, the memory device 100 may output the third logical page data stored in the third latches to the memory controller in response to a third latch select signal for selecting the third latches while discharging voltages provided to a word line and bit lines coupled to the selected memory cells.

Figure 11:
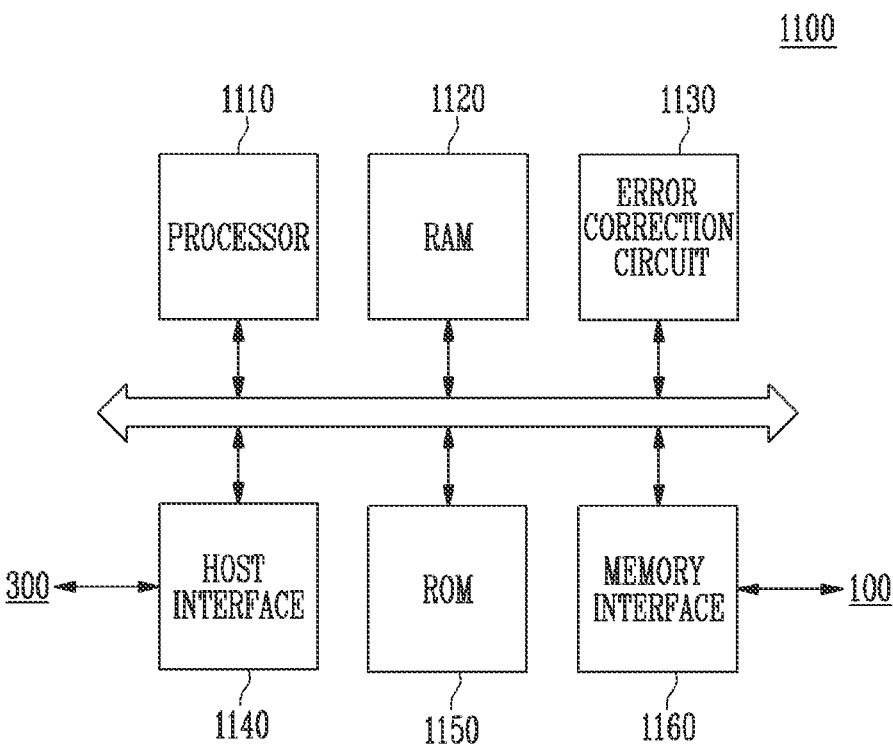
FIG. 11 is a diagram illustrating an embodiment of the memory controller of FIG. 1.

FIG. 11 is a diagram illustrating the memory controller of FIG. 1.

Referring to FIG. 11, the memory controller 1100 may include a processor 1110, a random access memory (RAM) 1120, an error correction circuit 1130, a host interface 1140, a read only memory (ROM) 1150, and a memory interface 1160.

The processor 1110 may control the overall operation of the memory controller 1100. The processor 1110 may control the operation of the memory controller 1100 to read data requested by a host 300 from the memory device 100. In an embodiment, during a read operation, the processor 1110 may control the memory device 100 to successively perform sensing operations on LSB page data, CSB page data, and MSB page data. In an embodiment, the processor 1110 may control the memory device 100 to output the LSB page data, the CSB page data, and the MSB page data stored in the memory device 100.

The RAM 1120 may be used as a buffer memory, a cache memory or a working memory of the memory controller 1100. In an embodiment, the RAM 1120 may store the LSB page data, the CSB page data, and the MSB page data, which are read from the memory device 100.

The error correction circuit 1130 may perform error correction. The error correction circuit 1130 may perform error correction code (ECC) encoding based on data to be written to the memory device 100 through the memory interface 1160. The ECC-encoded data may be transferred to the memory device 100 through the memory interface 1160. The error correction circuit 1130 may perform error correction decoding (ECC decoding) on data received from the memory device 100 through the memory interface 1160.

The ROM 1150 may store various types of information required for the operation of the memory controller 1100 in the form of firmware.

The memory controller 1100 may communicate with an external device (e.g., the host 300, an application processor, or the like) through the host interface 1140. The memory controller 1100 may be provided with data through the host interface 1140. In an embodiment, the host interface 1140 may receive a read request from the host 300.

The memory controller 1100 may communicate with the memory device 100 through the memory interface 1160. The memory controller 1100 may transmit a command, an address, data, etc. to the memory device 100 through the memory interface 1160. In an embodiment, the memory interface 1160 may provide a read command, a status read command, and a page data output command to the memory device 100.

According to an embodiment of the present disclosure, there are provided a memory device capable of reducing the time required to perform a program operation and a read operation, and a memory system including the memory device and a memory controller.

What is claimed is:
1. A memory device, comprising:
    memory cells;

a plurality of latches configured to sense a plurality of pieces of logical page data stored in the memory cells; and an operation controller configured to output a first latch select signal for selecting first latches, by which first logical page data among the plurality of pieces of logical page data is sensed, from among the plurality of latches in response to a first page data output command, and output a second latch select signal for selecting second latches, by which second logical page data among the plurality of pieces of logical page data is sensed, from among the plurality of latches in response to a second page data output command; and control the first latches to output the first logical page data to a data input/output circuit while the second latches sense the second logical page data from the memory cells, wherein the first latches output the first logical page data in response to the first latch select signal and the second latches output the second logical page data in response to the second latch select signal.

2. The memory device according to claim 1, further comprising:

a read and busy (ready/busy) signal generator configured to output a busy signal while the plurality of pieces of logical page data are sensed by the plurality of latches.

3. The memory device according to claim 1, wherein the plurality of latches successively sense the plurality of pieces of logical page data in response to a read command.

4. The memory device according to claim 1, further comprising:

a status register configured to indicate that any one of the plurality of pieces of logical page data has been sensed by the plurality of latches.

5. The memory device according to claim 4, wherein the first page data output command is received in response to status information indicating that the first logical page data has been sensed by the first latches is stored in the status register.

6. The memory device according to claim 1, wherein the second latches output the second logical page data while third logical page data among the plurality of pieces of logical page data is sensed by third latches among the plurality of latches in response to the second latch select signal.

7. The memory device according to claim 6, wherein the third latches output the third logical page data in response to a third latch select signal for selecting the third latches while voltages provided to a word line or bit lines coupled to the memory cells are discharged.

8. A memory system, comprising:

a memory device including a plurality of latches configured to sense a plurality of pieces of logical page data stored in a physical page; and a memory controller configured to provide the memory device with a first page data output command that requests first logical page data among the plurality of pieces of logical page data, wherein the memory device is configured to:

transmit the first logical page data from first latches to the memory controller in response to activation of a first latch select signal for selecting the first latches in which the first logical page data is stored among the plurality of latches; and sense second logical page data among the plurality of pieces of logical page data by second latches among the plurality of latches while transmitting the first logical page data from the first latches to the memory controller.

9. The memory system according to claim 8, wherein the memory controller provides a read command that instructs the plurality of pieces of logical page data to be successively sensed.

10. The memory system according to claim 8, wherein the memory device further comprises:

a status register configured to store status information indicating that the second logical page data has been sensed by the second latches.

11. The memory system according to claim 10, wherein the memory controller provides the memory device with a second page data output command that requests the second logical page data based on the status information.

12. The memory system according to claim 11, wherein the memory device activates a second latch select signal for selecting the second latches in which the second logical page data is stored in response to the second page data output command.

13. The memory system according to claim 12, wherein the memory device transmits the second page data from the second latches to the memory controller in response to the second latch select signal.

14. The memory system according to claim 13, wherein the memory device senses third logical page data among the plurality of pieces of logical page data by third latches among the plurality of latches while transmitting the second logical page data from the second latches to the memory controller.

15. A memory device, comprising:

memory cells;

a plurality of latches coupled to the memory cells through bit lines; and a data input/output circuit configured to receive a plurality of pieces of logical page data from an external device; and an operation controller configured to:

output a first latch select signal for selecting first latches, in which first logical page data among the plurality of pieces of logical page data to be stored in the memory cells is to be stored, from among the plurality of latches in response to a program command; and output a second latch select signal for selecting second latches, in which second logical page data among the plurality of pieces of logical page data to be stored in the memory cells is to be stored, from among the plurality of latches in response to the program command, wherein the first latches directly store the first logical page data from the data input/output circuit, and the second latches directly store the second logical page data from the data input/output circuit.

16. The memory device according to claim 15, wherein:

the operation controller outputs the second latch select signal subsequent to outputting the first latch select signal, and the second latches directly store the second logical page data received from the external device in response to the second latch select signal.

17. The memory device according to claim 16, wherein the operation controller controls the plurality of latches so that the first logical page data and the second logical page data are stored in the memory cells.

* * * * *